US006638807B2

(12) United States Patent
Forbes et al.

(10) Patent No.: US 6,638,807 B2
(45) Date of Patent: Oct. 28, 2003

(54) TECHNIQUE FOR GATED LATERAL BIPOLAR TRANSISTORS

(75) Inventors: Leonard Forbes, Corvallis, OR (US); Wendell P. Noble, Milton, VT (US)

(73) Assignee: Mircon Technology, Inc., Boise, ID (US)

( * ) Notice: Subject to any disclaimer, the term of this patent is extended or adjusted under 35 U.S.C. 154(b) by 35 days.

(21) Appl. No.: 10/047,477

(22) Filed: Oct. 23, 2001

(65) Prior Publication Data

US 2002/0102803 A1 Aug. 1, 2002

Related U.S. Application Data

(62) Division of application No. 09/050,728, filed on Mar. 30, 1998, now Pat. No. 6,307,235.

(51) Int. Cl.[7] ........................................... H01L 21/8249
(52) U.S. Cl. ...................... 438/236; 438/316; 438/309; 438/335
(58) Field of Search ................................ 438/202, 204, 438/236, 316, 335, 309; 257/565, 575, 350, 67, 347, 351, 378, 262

(56) References Cited

U.S. PATENT DOCUMENTS

| 4,450,048 A | 5/1984 | Gaulier | 204/15 |
| 4,673,962 A | 6/1987 | Chatterjee et al. | 357/23.6 |

(List continued on next page.)

OTHER PUBLICATIONS

Blalock, T.N., et al., "A High–speed Sensing Scheme for 1T Dynamic RAMs Utilizing the Clamped Bit–line Sense Amplifier", *IEEE Journal of Solid–State Circuits*, 27(4), 618–625, (Apr., 1992).

Chen, M.J., et al., "Back–Gate Forward Bias Method for Low–Voltage CMOS Digital Circuits", *IEEE Transactions on Electron Devices, 43*, 904–909, (Jun. 1996).

Chen, M.J., et al., "Optimizing the Match in Weakly Inverted MOSFET's by Gated Lateral Bipolar Action", *IEEE Transactions on Electron Devices, 43*, 766–773, (May 1996).

Chung, I.Y., et al., "A New SOI Inverter for Low Power Applications", *Proceedings of the 1996 IEEE International SOI Conference*, Sanibel Island, FL, 20–21, (1996).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters, 17*(11), pp. 509–511, (Nov.1996).

(List continued on next page.)

*Primary Examiner*—William David Coleman
*Assistant Examiner*—Hsien Ming Lee
(74) *Attorney, Agent, or Firm*—Schwegman, Lundberg, Woessner & Kluth, P.A.

(57) ABSTRACT

An improved structure and method for gated lateral bipolar transistors are provided. Embodiments of the present invention capitalize on opposing sidewalls and adjacent conductive sidewall members to conserve available surface space on the semiconductor chips. Additionally, the gate and body of the transistors are biased to modify the threshold voltage of the transistor ($V_t$). The conductive sidewall member configuration conserves surface space and achieves a higher density of surface structures per chip. The structures offer performance advantages from both metal-oxide semiconductor (MOS) and bipolar junction transistor (BJT) designs. The devices can be used in a variety of applications, digital and analog, wherever a more compact structure with low power consumption and fast response time is needed.

44 Claims, 15 Drawing Sheets

U.S. PATENT DOCUMENTS

| | | | | |
|---|---|---|---|---|
| 4,922,315 | A | 5/1990 | Vu | 357/35 |
| 4,987,089 | A | 1/1991 | Roberts | 437/34 |
| 4,996,574 | A | 2/1991 | Shirasaki | 357/23.7 |
| 5,006,909 | A | 4/1991 | Kosa | 357/23.6 |
| 5,023,688 | A | 6/1991 | Ando et al. | 357/42 |
| 5,097,381 | A | 3/1992 | Vo et al. | 361/313 |
| 5,122,848 | A | 6/1992 | Lee et al. | 357/23.6 |
| 5,250,450 | A | 10/1993 | Lee et al. | 437/40 |
| 5,315,143 | A | 5/1994 | Tsuji | 257/351 |
| 5,350,934 | A | 9/1994 | Matsuda | 257/139 |
| 5,453,636 | A | 9/1995 | Eitan et al. | 257/378 |
| 5,488,236 | A | 1/1996 | Baliga et al. | 257/132 |
| 5,491,356 | A | 2/1996 | Dennison et al. | 257/306 |
| 5,508,544 | A | 4/1996 | Shah | 257/316 |
| 5,528,062 | A | 6/1996 | Hsieh et al. | 257/298 |
| 5,541,432 | A | 7/1996 | Tsuji | 257/350 |
| 5,554,870 | A | 9/1996 | Fitch et al. | 257/334 |
| 5,581,104 | A | 12/1996 | Lowrey et al. | |
| 5,585,998 | A | 12/1996 | Kotecki et al. | 361/321.4 |
| 5,587,665 | A | 12/1996 | Jiang | 326/16 |
| 5,646,900 | A | 7/1997 | Tsukude et al. | 365/205 |
| 5,680,345 | A | 10/1997 | Hsu et al. | 365/185.01 |
| 5,691,230 | A | 11/1997 | Forbes | 437/62 |
| 5,796,143 | A | 8/1998 | Fulford, Jr. et al. | 257/330 |
| 5,796,166 | A | 8/1998 | Agnello et al. | 257/751 |
| 5,844,273 | A | 12/1998 | Konishi | 257/331 |
| 5,892,260 | A | 4/1999 | Okumura et al. | 257/347 |
| 5,907,170 | A | 5/1999 | Forbes et al. | 257/296 |
| 5,909,618 | A | 6/1999 | Forbes et al. | 438/242 |
| 5,914,511 | A | 6/1999 | Noble et al. | 257/302 |
| 5,936,274 | A | 8/1999 | Forbes et al. | 257/315 |
| 5,973,356 | A | 10/1999 | Noble et al. | 257/319 |
| 6,025,225 | A * | 2/2000 | Forbes et al. | 438/243 |
| 6,075,272 | A | 6/2000 | Forbes et al. | 257/378 |

OTHER PUBLICATIONS

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers*, 286–287, (1997).

Holman, W.T., et al., "A Compact Low Noise Operational Amplifier for a 1.2 Micrometer Digital CMOS Technology", *IEEE Journal of Solid–State Circuits, 30*, 710–714, (Jun. 1995).

Horiguchi, et al., "Switched–Source–Impedance CMOS Circuit for Low Standby Subthreshold Current Giga–Scale LSIs", *IEEE Journal of Solid State Circuits*, vol 28, 1131–1135, (1993).

Huang, W.L., et al., "TFSOI Complementary BiCMOS Technology for Low Power Applications", *IEEE Transactions on Electron Devices, 42*, 506–512, (Mar. 1995).

Ko, et al., "High–gain Lateral Bipolar Action in a MOSFET Structure", *IEEE Trans. on Electron Devices*, vol 38, No 11, 2487–96, (Nov. 1991).

MacSweeney, D., et al., "Modelling of Lateral Bipolar Devices in a CMOS Process", *IEEE Bipolar Circuits and Technology Meeting*, Minneapolis, MN, 27–30, (Sep. 1996).

Parke, S.A., et al., "A High–Performance Lateral Bipolar Transistor Fabricated on SIMOX", *IEEE Electron Device Letters, 14*, 33–35, (Jan. 1993).

Rabaey, *Digital Integrated Circuits*, Prentice Hall, Englewood Cliffs, NJ, 222–232, (1996).

Saito, M., et al., "Technique for Controlling Effective Vth in Multi–Gbit DRAM Sense Amplifier", *1996 Symposium on VLSI Circuits, Digest of Technical Papers*, Honolulu, HI, 106–107, (Jun. 13–15, 1996).

Seevinck, E., et al., "Current–Mode Techniques for High–Speed VLSI Circuits with Application to Current Sense Amplifier for CMOS SRAM's", *IEEE Journal of Solid State Circuits,* 26(4), pp. 525–536, (Apr. 1991).

Shimomura, K., et al., "A 1V 46ns 16Mb SOI–DRAM with Body Control Technique", *1997 IEEE International Solid–State Circuits Conference, Digest of Technical Papers*, 68–69, (Feb. 6, 1997).

Tsui, P.G., et al., "A Versatile Half–Micron Complementary BiCMOS Technology for Microprocessor–Based Smart Power Applications", *IEEE Transactions on Electron Devices, 42*, 564–570, (Mar. 1995).

Tuinega, *A Guide to Circuit Simulation and Analysis Using PSPICE*, Prentice Hall, Englewood Cliffs, NJ, (1988).

Wong, et al., "A 1V CMOS Digital Circuits with Double–Gate Driven MOSFET", *IEEE Int. Solid State Circuits Conference*, San Francisco, 292–93, (1997).

Yilmaz, H., et al., "Recent Advances in Insulated Gate Bipolar Transistor Technology", *IEEE Transactions on Industry Applications, 26*(5), pp. 831–834, (Sep. 1990).

* cited by examiner

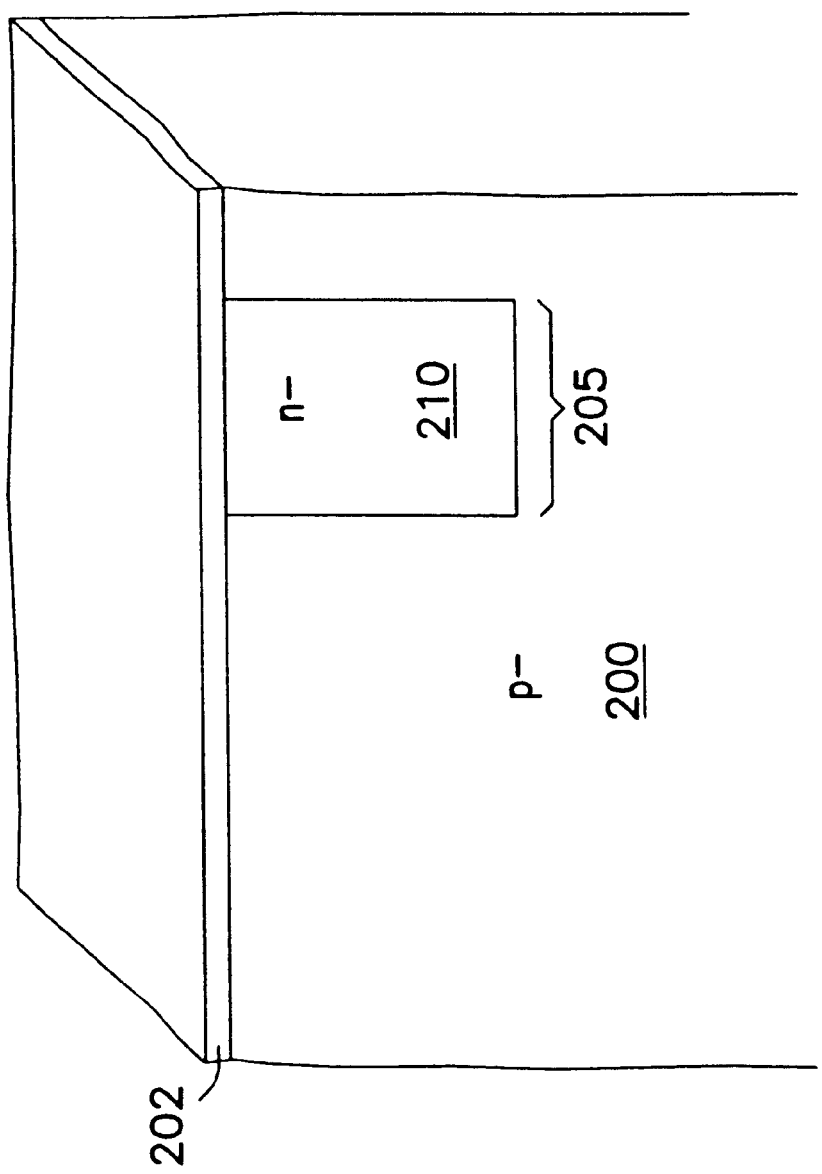

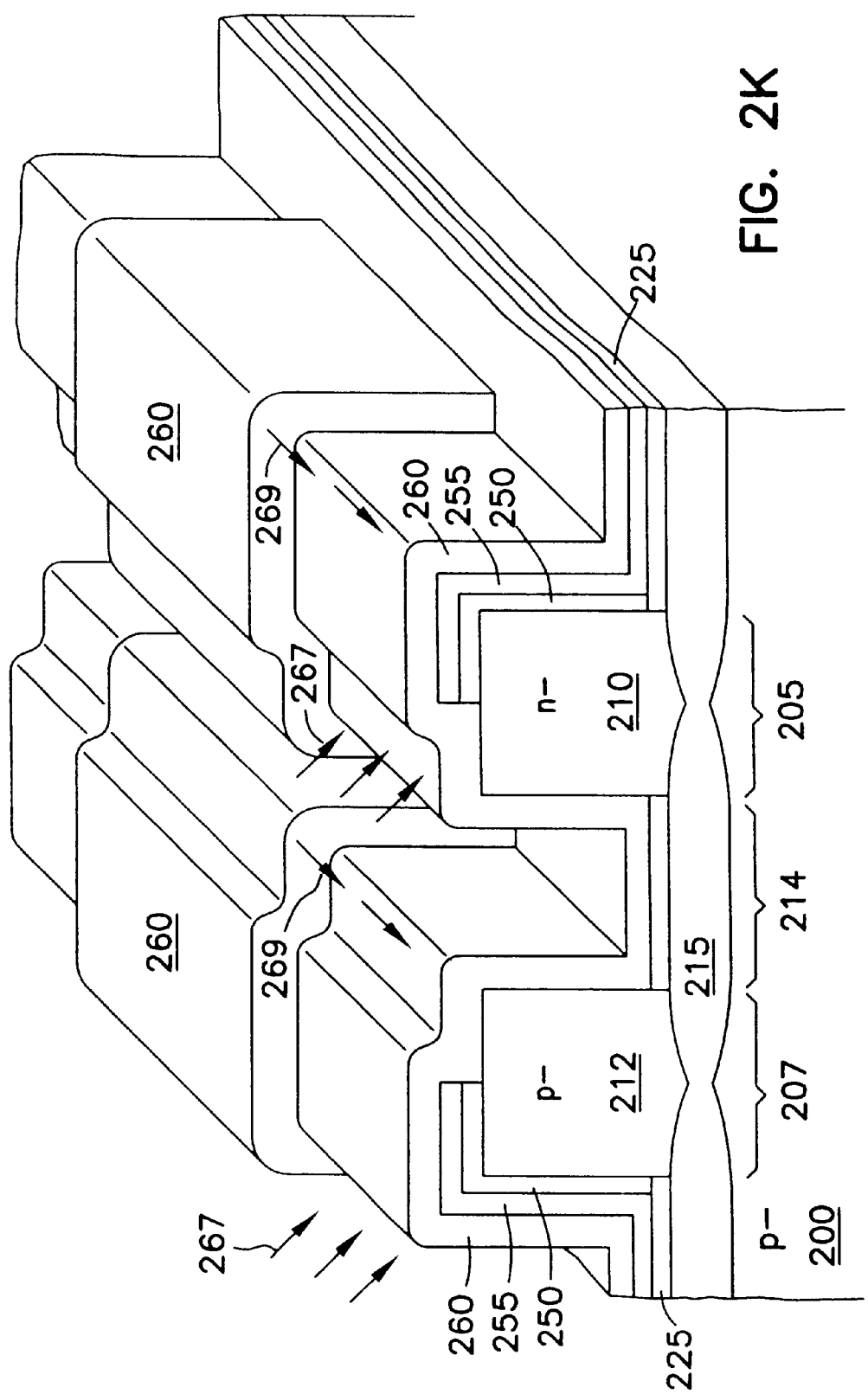

TECHNIQUE FOR GATED LATERAL BIPOLAR TRANSISTORS

RELATED APPLICATIONS

This application is a Divisional of U.S. application Ser. No. 09/050,728, filed Mar. 30, 1998. This application is related to the following co-filed and commonly assigned applications, U.S. application Ser. No. 09/050,275, now U.S. Pat. No. 6,229,342, entitled "Circuits and Methods for Body Contacted and Backgated Transistors" and U.S. application Ser. No. 09/050,281, now U.S. Pat. No. 6,097,065, entitled "Circuits and Methods for Dual-Gated Transistors" which are hereby incorporated by reference.

FIELD OF THE INVENTION

The present invention relates generally to semiconductor integrated circuits. More particularly, it pertains to circuits, methods and structure for gated lateral bipolar transistors.

BACKGROUND OF THE INVENTION

Integrated circuit technology relies on transistors to formulate vast arrays of functional circuits. The complexity of these circuits require the use of an ever increasing number of linked transistors. As the number of transistors required increases, the surface space on silicon chip/die dwindles. It is one objective, then, to construct transistors which occupy less surface area on the silicon chip/die.

Metal-oxide semiconductor field effect transistors (MOS transistors) are prevalent in integrated circuit technology because they generally demand less power than their counterpart, bipolar transistors. Bipolar transistors, on the other hand, also possess certain advantages over MOS transistors, such as speed. Therefore, it is another objective and attempts have been made to combine the technological designs of bipolars and MOS transistors in an effort to maximize the benefits of both transistor types.

Various types of lateral transistors have been historically described and utilized in complementary metal-oxide semiconductor (CMOS) technology. Lateral bipolar transistors have received renewed interest with the advent of bipolar complementary metal-oxide semiconductor (BiCMOS) technologies. Recently the action of newer devices has been described in new terms and a more careful distinction made between the different types of transistor action possible. Both gate-body connected MOS transistors and gated lateral bipolar transistors have been described. The term gate-body connected transistors is used to describe vertical or other device structures where the body of the MOS transistor also serves as the base of a bipolar transistor but each device functions separately as a normal transistor and MOS transistor action is dominant. Applying the gate voltage to the body serves primarily to change the threshold voltage of the MOS transistor.

Other structures are possible where the gate and base are common and the bipolar transistor and MOS transistor are in parallel but the bipolar transistor current is dominant. In a gated lateral transistor, not only the structures but also the operation is merged and most current flows along a surface under the gate in either MOS or bipolar operation. In the case of a gated lateral bipolar transistor, at low gate voltages around threshold ($V_t$), they can act as gate-body connected MOS transistors. At higher input voltages, $V_t$ or more, the bipolar action can dominate and they are more appropriately described as gated lateral bipolar transistors.

Much effort has been placed into the study of these merged transistor structures. Both vertical and lateral structures have been studied. These studies do not look to solutions for conserving precious die space in the fabrication of integrated circuits. Likewise, previous efforts have not been able to combine low power operation with enhanced operation characteristics and simultaneously maximize switching speeds. It is desirable then to improved transistor structures, circuits and methods which have advanced operation characteristics and low power consumption. Any improved configuration of transistor structure should remain fully integrateable with prevalent integrated circuit design.

SUMMARY OF THE INVENTION

The above mentioned problems with integrated circuits and other problems are addressed by the present invention and will be understood by reading and studying the following specification. A structure and method are described which accord these benefits.

In particular, an illustrative embodiment of the present invention includes a gated lateral bipolar transistor. The gated lateral bipolar transistor includes a single crystalline semiconductor structure which has an upper surface and opposing sidewall surfaces. The single crystalline semiconductor structure has a source/emitter region, a body/base region, and a collector/drain region. The source/emitter region and the collector/drain region are located on a first one of the opposing sidewall surfaces. A dielectric layer is disposed between the source/emitter region and the collector/drain region. A gate is formed on the dielectric layer on the first one of the opposing sidewall surfaces. A body contact is coupled to the body/base region on a second one of the opposing sidewall surfaces, such that the transistor exhibits both bipolar junction transistor (BJT) and metal-oxide semiconductor (MOS) action.

In another embodiment, a gated lateral bipolar transistor is provided. The gated lateral bipolar transistor includes a single crystalline semiconductor structure which has an upper surface and opposing sidewall surfaces. The single crystalline semiconductor structure has a source/emitter region, a body/base region, and a collector/drain region. The source/emitter region and the collector/drain region are located on a first one of the opposing sidewall surfaces. A pair of conductive sidewall members are disposed adjacent to the opposing sidewall members and a first one of the pair is separated from a first one of the opposing sidewall surfaces by a gate oxide. The second one of the pair couples directly to a second one of the opposing sidewall surfaces.

In another embodiment, a method of fabricating a gated lateral bipolar transistor is provided. The method includes forming a single crystalline semiconductor structure on a substrate. The structure is formed to include a body/base region, an upper surface, and opposing sidewall surfaces. The method includes forming an insulator layer between the substrate and the single crystalline semiconductor structure. A source/emitter region and a collector/drain region are formed on a first one of the opposing sidewall surfaces. A dielectric layer is formed between the source/emitter region and the collector/drain region. A gate is formed on the dielectric layer and a body contact is coupled to the body/base region on a second one of the opposing sidewall surfaces, such that the transistor exhibits both bipolar junction transistors (BJT) and metal-oxide semiconductor (MOS) action.

In another embodiment, a method of fabricating a gated lateral bipolar transistor is provided. The method includes forming a single crystalline semiconductor structure. The structure is formed to include a body/base region, an upper surface and opposing sidewall surfaces. A source/emitter region and a collector/drain region are formed on a first one of the opposing sidewall surfaces. The method includes forming a pair of conductive sidewall members so that the members are disposed adjacent to the opposing sidewall members. Forming the pair includes forming a gate oxide located between a first one of the pair and the first one of the opposing sidewall surfaces. A second one of the pair is formed coupling directly to a second one of the opposing sidewall surfaces.

Thus, improved transistor structures are provided along with the methods for producing the same. The transistors combine BJT and MOS transistor conduction. These new transistor structures allow for low voltage level operation and enhanced switching action over conventional bipolar complementary metal-oxide semiconductor (BiCMOS) devices. These gated lateral bipolar transistors are fully compatible with CMOS technology. Thus, the transistor structures do not require additional chip surface space, nor additional processing steps.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

FIGS. 2A–2M illustrate an embodiment of a process of fabrication of a gated lateral bipolar transistor.

DETAILED DESCRIPTION

Figure 1A:
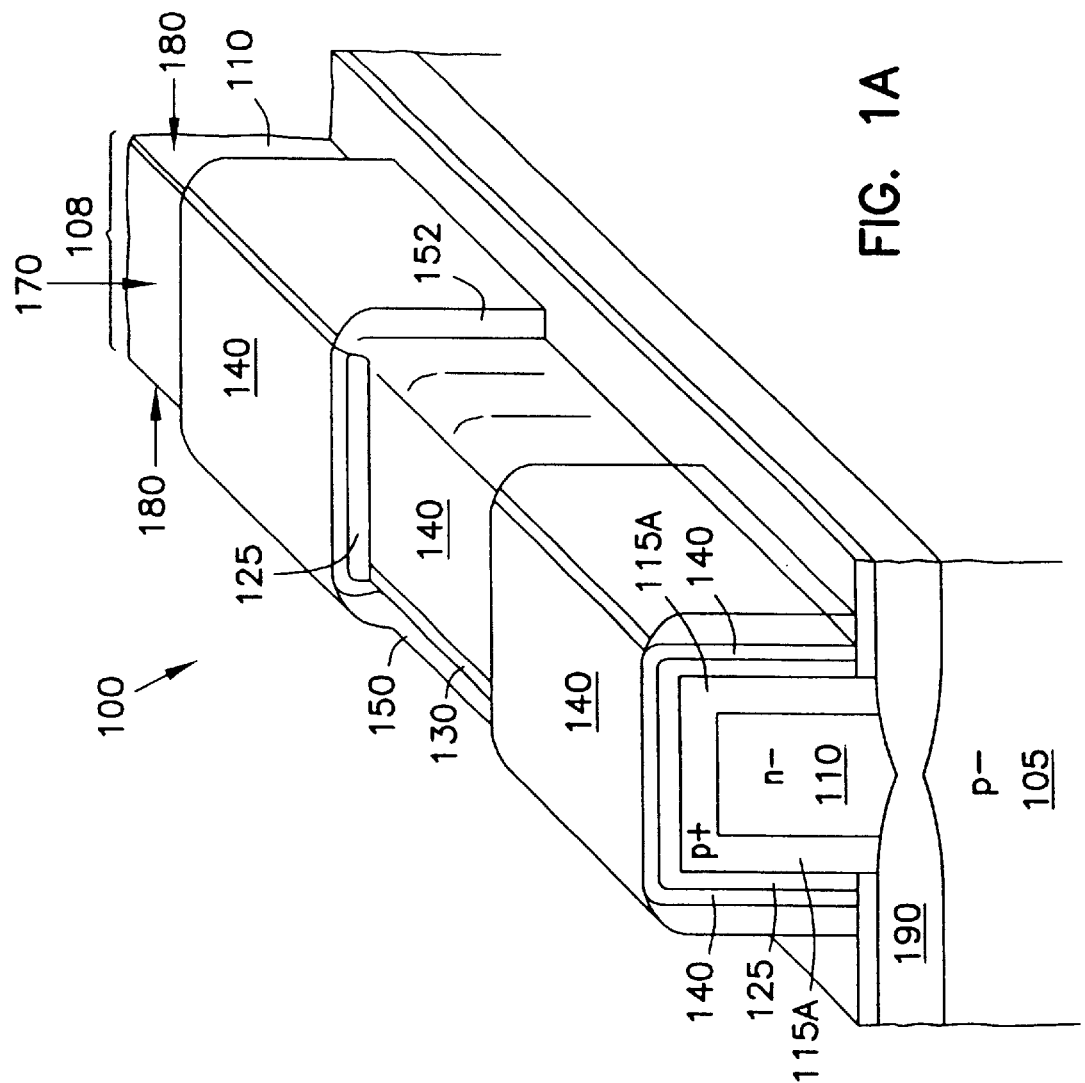
FIG. 1A is a perspective view illustrating an embodiment of a gated lateral bipolar transistor according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

FIG. 1A is a perspective view illustrating one embodiment of a gated lateral bipolar transistor 100, according to the teachings of the present invention. FIG. 1A illustrates that the gated lateral bipolar transistor 100 has a single crystalline semiconductor structure 108. The single crystalline semiconductor structure 108 has a body/base region 110, an upper surface 170 and opposing sidewall surfaces 180. The single crystalline semiconductor structure 108 has a source/emitter region 115A and a collector/drain region 115B, shown in FIG. 1B. In one embodiment, the source/emitter region 115A and the collector/drain region 115B are located on the upper surface 170 and on both of the opposing sidewall surfaces 180. A dielectric layer 130 is formed on one of the opposing sidewall surfaces 180. The dielectric layer 130 is disposed between the source/emitter region 115A and the collector/drain region 115B on one of the opposing sidewall surfaces. A gate 150 is formed on the dielectric layer 130 on the opposing sidewall surface 180. A body contact 152 is formed on the other of the opposing sidewall surfaces 180, such that the transistor exhibits both bipolar junction transistor (BJT) and metal-oxide semiconductor (MOS) action. In one embodiment, the body contact 152 is formed of p+ silicon material and the body/base region is formed of p− silicon material. In another embodiment, the body contact is formed of n+ silicon material and the body/base region is formed of n− silicon material. In one embodiment, the gate 150 and the body contact 152 are electrically biased from a single source. The body/base region 110 is illustrated formed on an insulator layer 190, formed on a p− silicon substrate 105.

Another embodiment, also exemplified by FIG. 1A, includes a single crystalline semiconductor structure 108. The single crystalline semiconductor structure 108 again has a body/base region 110, an upper surface 170 and opposing sidewall surfaces 180. The body/base region 110 is formed from a p− silicon material. The body/base region 110 is formed on an insulator layer 190, formed on a substrate 105 of p− silicon material. The single crystalline semiconductor structure 108 has a source/emitter region 115A and a collector/drain region 115B on one of the opposing sidewall surfaces 180. In one embodiment, the source/emitter region 115A and the collector/drain region 115B are located on the upper surface 170 and on both of the opposing sidewall surfaces 180. The structure 108 includes a pair of conductive sidewall members, 150 and 152 respectively. A nitride layer 140 and a doped glass layer 125 separate the conductive sidewall members from source/emitter region 115A and collector/drain region 115B, shown in FIG. 1B, in a p-channel metal-oxide semiconductor (PMOS) embodiment. According to the teachings of the present invention, the nitride layer 140 is absent in an n-channel metal-oxide semiconductor (NMOS) embodiment. A portion of a first one 150 of the pair of conductive sidewall members, 150 and 152, is separated from a one of the opposing sidewall surfaces 180 by a gate oxide 130. A second one 152 of the pair of conductive sidewall members, 150 and 152, couples directly to a portion of the other of the opposing sidewall surfaces 180 and is more highly doped than the body/base region 110. The conductive sidewall members, 150 and 152, are doped polysilicon. In one embodiment, the first one of the conductive sidewall members 150 is formed of n+ silicon material, and the body/base region 110 is formed of p– silicon material. In an alternate embodiment, the first one of the conductive sidewall members 150 is formed of p+ silicon material, and the body/base region 110 is formed of n– silicon material.

Figure 1B:
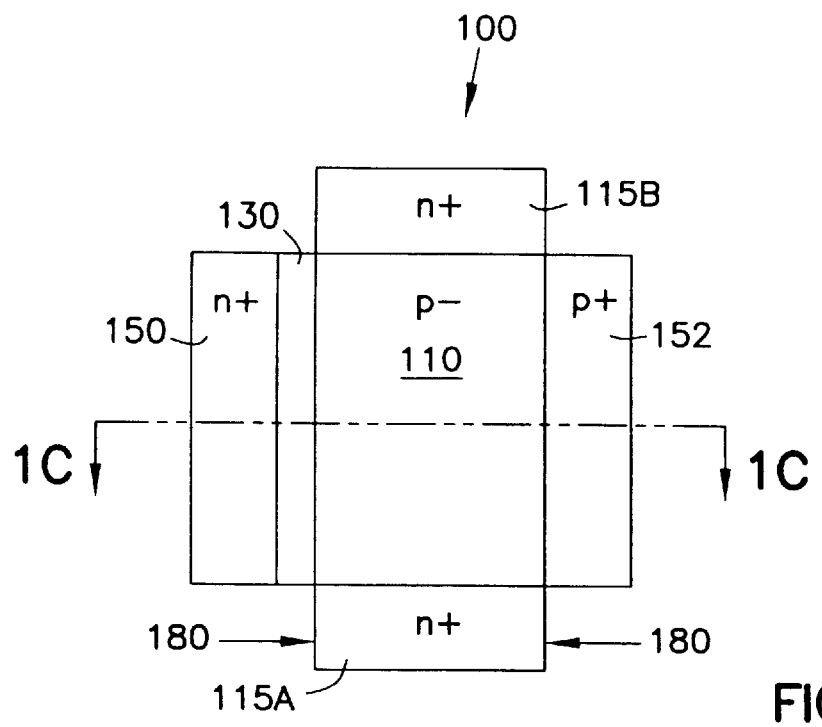
FIG. 1B is a top view of the gated lateral bipolar transistor shown in FIG. 1A.

FIG. 1B provides a top view of the structure shown in FIG. 1A with the nitride layer 140 and doped glass layer 125 cut away for illustrative purposes. FIG. 1B illustrates the source/emitter region 115A and the collector/drain region 115B. FIG. 1B also illustrates a first one 150 of the pair of conductive sidewall members, 150 and 152 respectively, separated from a portion of one of the opposing sidewall surfaces 180 by a gate oxide 130. Also shown in FIG. 1B is the second conductive sidewall member 152 which is coupled directly to a portion of the other of the opposing sidewall surfaces 180.

Figure 1C:
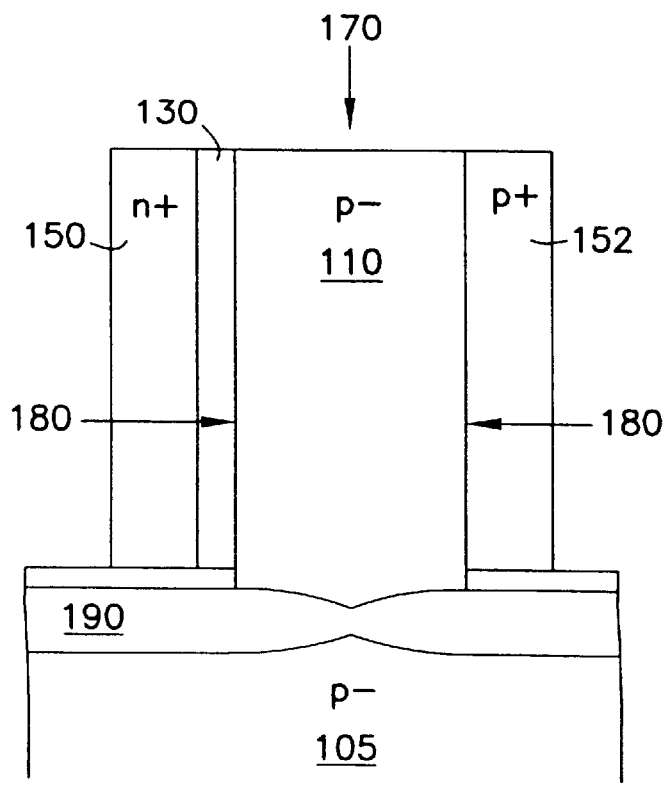
FIG. 1C is a front view illustrating an embodiment of gated lateral bipolar transistor of FIG. 1B.

FIG. 1C provides an end view of the structure shown in FIG. 1A along cut line 1C—1C. The end view of FIG. 1C illustrates the conductive sidewall member 150 formed on the gate oxide 130. FIG. 1C illustrates the conductive sidewall member 152 coupled directly to an opposing sidewall surface 180. In one embodiment, the pair of conductive sidewall members, 150 and 152, are electrically biased independently from one another. In an alternative embodiment, the pair of conductive sidewall members, 150 and 152, are coupled to a single source potential.

The operation of the gated lateral bipolar transistor 100 is given by applying a potential to the pair of conductive sidewall members, 150 and 152. The potential applied to the first one 150 of the pair, 150 and 152, creates an inversion region in the adjacent opposing sidewall surface 180. The potential applied to a second one 152 of the pair, 150 and 152, is directly applied to its adjacent opposing sidewall. For the correct applied potential, conduction then occurs between the source/emitter region 115A and the collector/drain region 115B within the body/base region 110.

At low values of applied potential, e.g., close to the threshold potential ($V_t$), the gated lateral bipolar transistor 100 exhibits metal-oxide semiconductor (MOS) conduction action and the majority of this occurs in the inversion region underneath the first conductive sidewall member 150. Applying the potential of the second one 152 of the conductive sidewall members serves primarily to change the threshold voltage of the MOS conduction action. For greater applied potentials, e.g., larger than $V_t$, the gated lateral bipolar transistor 100 exhibits distinct bipolar junction transistor (BJT) conduction action in addition to the MOS conduction action. For even higher applied potentials, e.g., much greater than $V_t$, the BJT conduction action dominates. In the exemplary embodiment, this gated lateral bipolar transistor is optimized for BJT action and the doping concentration in the second one 152 of the pair of conductive sidewall members, 150 and 152, is adjusted for the same.

Figure 2B:
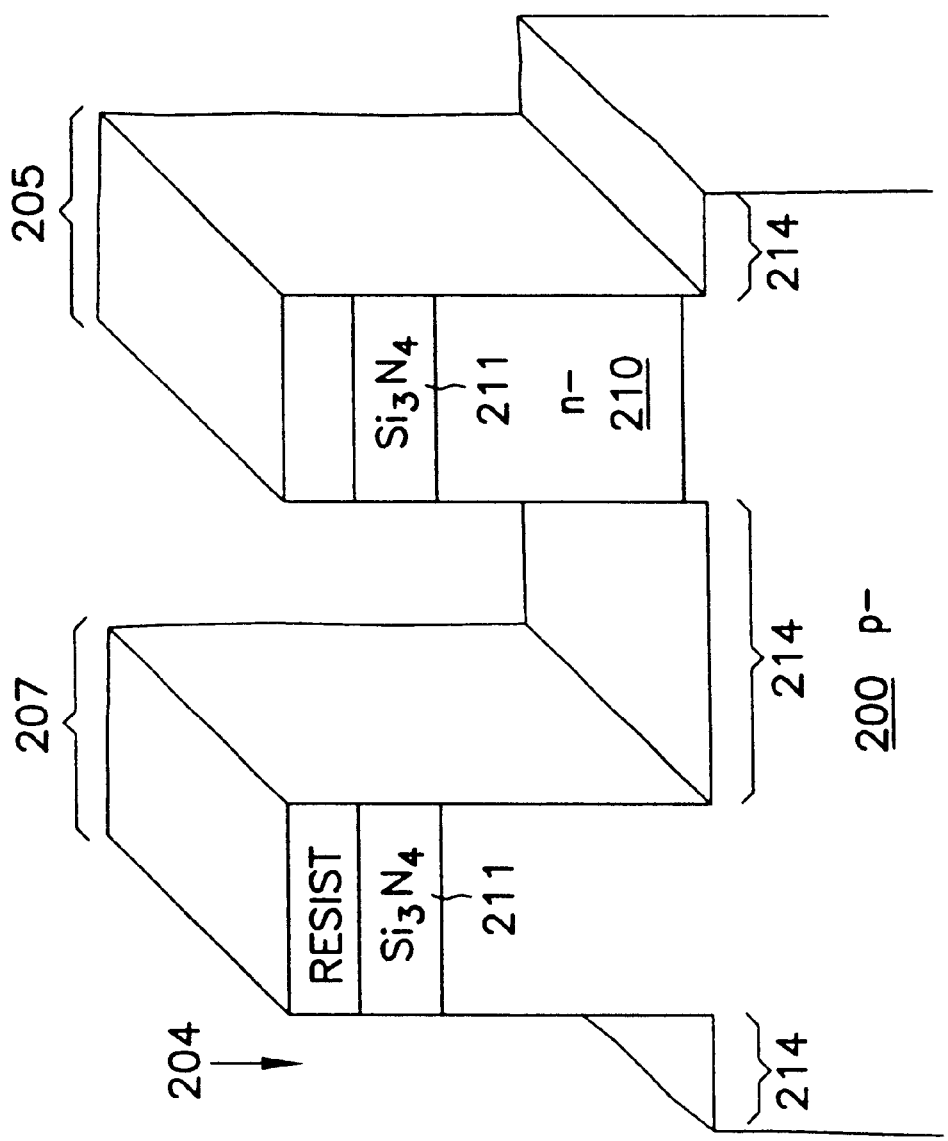

FIGS. 2A through 2M illustrate an embodiment of the various processing steps for fabricating a complementary pair of gated lateral bipolar transistors. FIG. 2A begins with a lightly doped p– silicon substrate 200. A thin screen oxide layer 202 is thermally grown. The oxide layer 202 is formed to a thickness of approximately 10 nanometers (nm). A photoresist is applied and selectively exposed to reveal p-channel metal-oxide semiconductor (PMOS) device regions 205. Wells of n-type silicon material are formed in the substrate 200 to form the PMOS device regions 205. The n-wells 210 of n-type material can be formed by any suitable method, such as by ion implantation. The n-wells 210 are formed to a depth of approximately 1.0 micrometer ($\mu$m). The photoresist is removed using conventional photoresist stripping techniques. The structure is then annealed, such as by a rapid thermal anneal (RTA) process, to achieve the desired doping profile. The structure is now as it appears in FIG. 2A.

FIG. 2B illustrates the structure after the next sequence processing steps. A silicon nitride ($Si_3N_4$) pad layer 211 is deposited on the upper surface 204 of the substrate 200 and the n-wells 210. The nitride layer 211 is formed by any suitable means, such as by chemical vapor deposition (CVD). The nitride layer 211 is formed to a thickness of approximately 0.4 $\mu$m. A photoresist is applied and selectively exposed to mask stripes which define active device regions, including n-channel metal-oxide semiconductor (NMOS) device region 207 and PMOS device region 205. The nitride layer 211 in between device regions, 205 and 207, is removed. The nitride layer 211 is removed by any suitable etching technique, such as by RIE. The p– substrate material 200 etched to a depth of approximately 0.2 $\mu$m below the bottom of the n-well 210/substrate 200 interface. These etching steps leave trenches 214 between the device regions 207 and 205. The etching is performed though any suitable process, such as by RIE. The structure is now as shown in FIG. 2B. The photoresist is next stripped, using conventional photoresist stripping techniques.

Figure 2C:
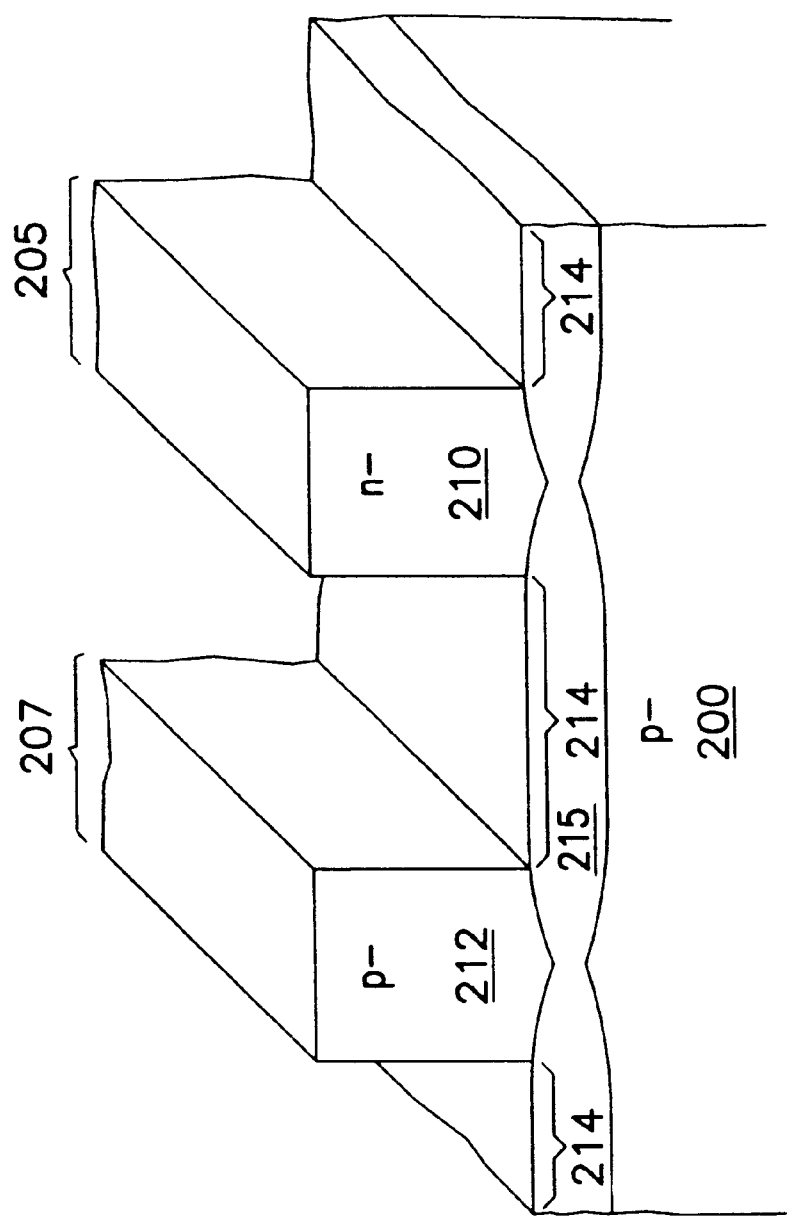

FIG. 2C illustrates the structure after the next series of processing steps. An insulator layer 215 is formed beneath the device regions, 205 and 207 respectively so as to form a semiconductor on insulator (SOI) structure. The insulator layer 215 is formed using, for example, the techniques of U.S. application Ser. No. 08/745,708, entitled Silicon-On-Insulator Islands and Method for Their Formation (the '708 Application), or U.S. Pat. No. 5,691,230, entitled Technique for Producing Small Islands of Silicon on Insulator (the '230 Patent). The '708 Application and the '230 Patent are incorporated by reference. The insulator layer 215 separates the p– single crystalline silicon structure 212 of the NMOS device region 207, and the single crystalline silicon structure n-well 210 of the PMOS device region 205 from the substrate 200. Any of the nitride layer 211 left on the device regions 205 and 207 is removed by reactive ion etching (RIE). The structure is now as illustrated in FIG. 2C.

Figure 2D:
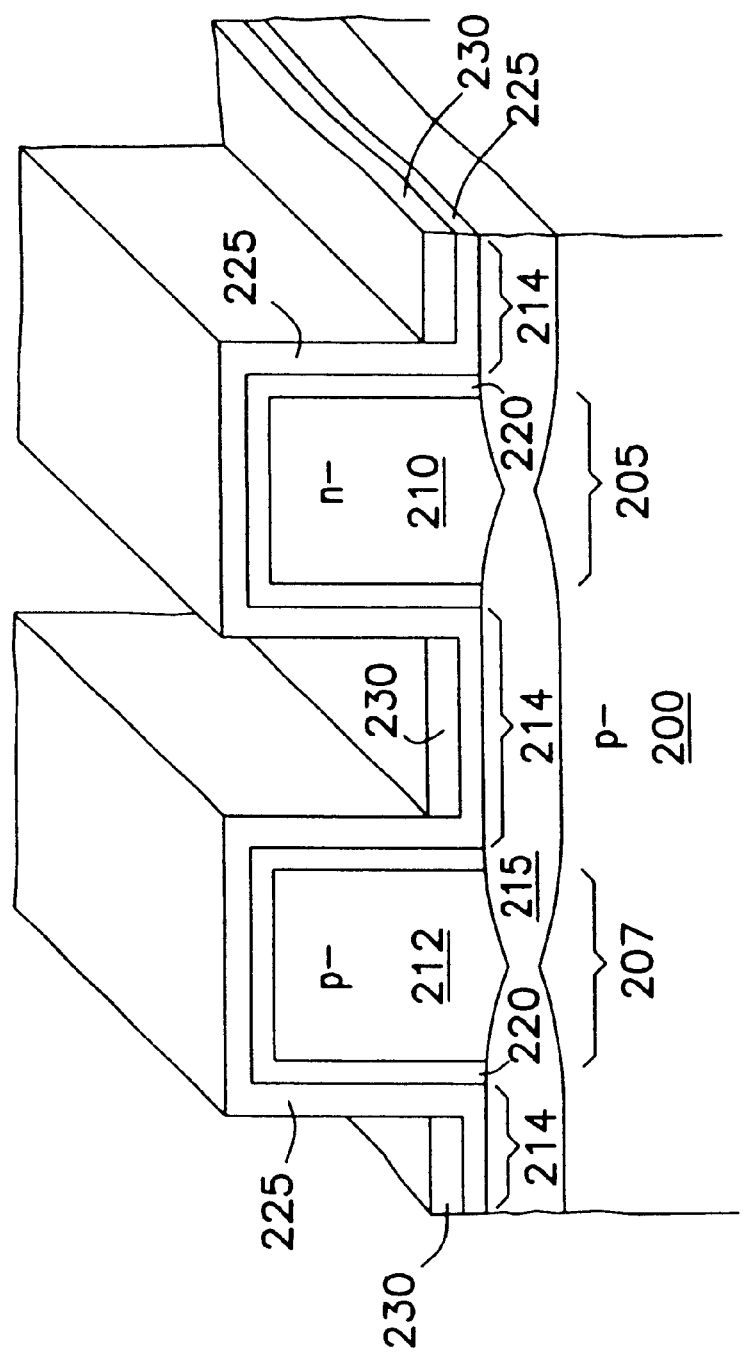

FIG. 2D illustrates the structure following the next series of processing steps. A thin oxide layer 220 is thermally grown on active device regions, 205 and 207. The oxide layer 220 is grown to a thickness of approximately 20 nanometers (nm). A thin silicon nitride ($Si_3N_4$) layer 225 is deposited over the entire surface by CVD. The nitride layer 225 is deposited to a thickness of approximately 50 nm. Intrinsic polysilicon 230 is deposited by any suitable methods, such as by CVD, to fill the trenches 214. Next, the trenches 214 are planarized stopping on the nitride pads 225. The intrinsic polysilicon 230 in trenches 214 can be planarized by any suitable process, such as by chemical mechanical polishing/planarization (CMP). The intrinsic polysilicon 230 is selectively etched back, such as by RIE, to leave only a thin layer on the bottom of trenches 214. The structure is now as is shown in FIG. 2D.

Figure 2E:
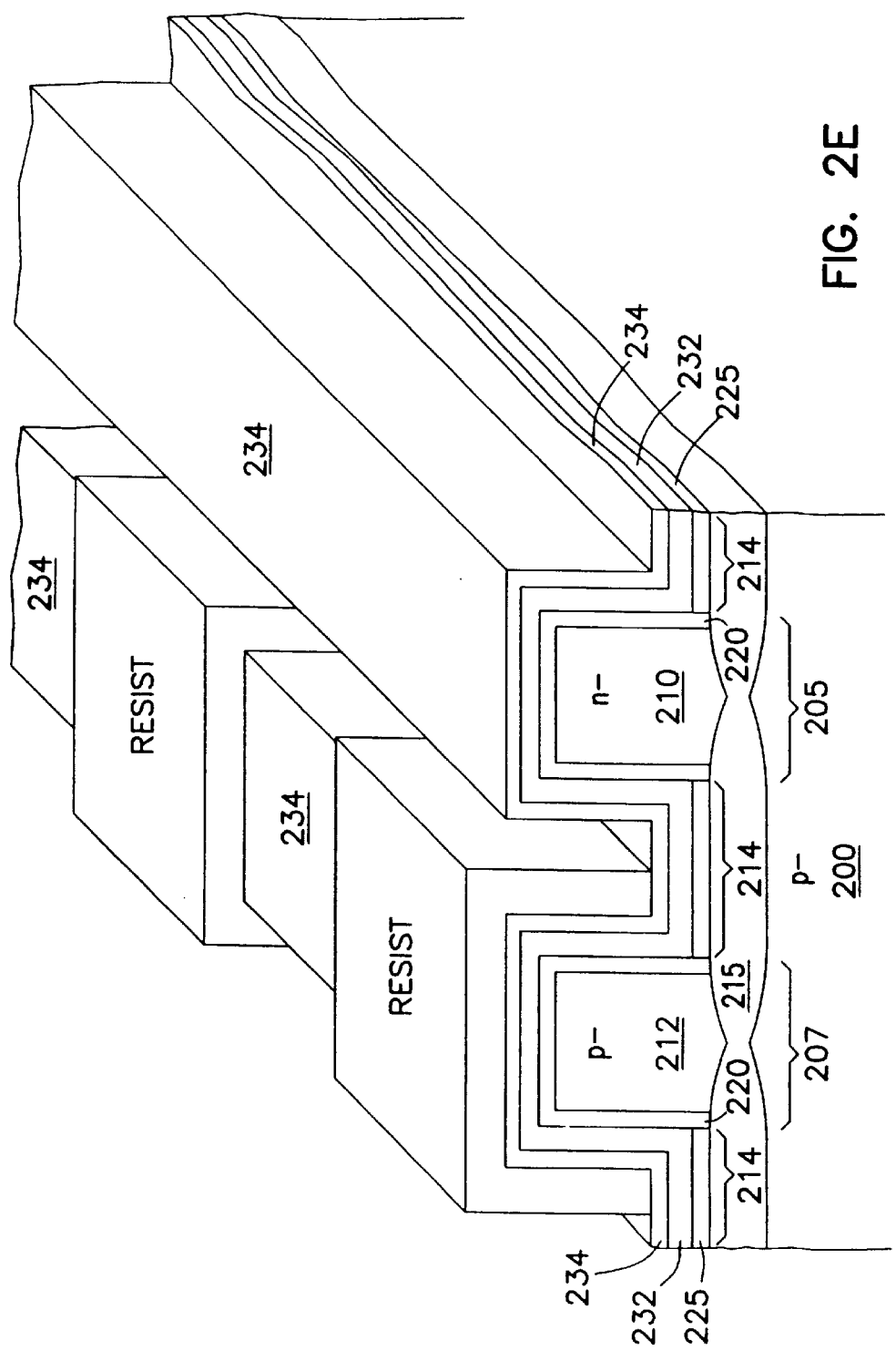

FIG. 2E shows the structure following the next sequence of processing steps. Every exposed portion of the nitride layer 225 is removed by RIE, leaving only the nitride 225 covered by the intrinsic polysilicon 230 at the bottom of the trenches 214. The intrinsic polysilicon 230 is then removed by RIE. The device regions, 205 and 207 respectively, remain protected by the oxide layer 220. Next, n-doped glass 232 is deposited, such a by CVD. In one embodiment the n-doped glass 232 is Arsenic silicate glass (ASG). In another embodiment, the n-doped glass 232 is phosphorus silicate glass (PSG). The n-doped glass 232 is deposited to a thickness of approximately 100 nm. A new silicon nitride ($Si_3N_4$) layer 234 is deposited over the n-doped glass 232. The new nitride layer 234 is CVD deposited to a thickness of approximately 20 nm. A photoresist is applied and selectively exposed to reveal PMOS device regions 205 and to pattern the n-doped glass 232 in the NMOS device regions 207 in the form of future source/emitter and collector/drain regions. The structure is now as is shown in FIG. 2E.

Figure 2F:
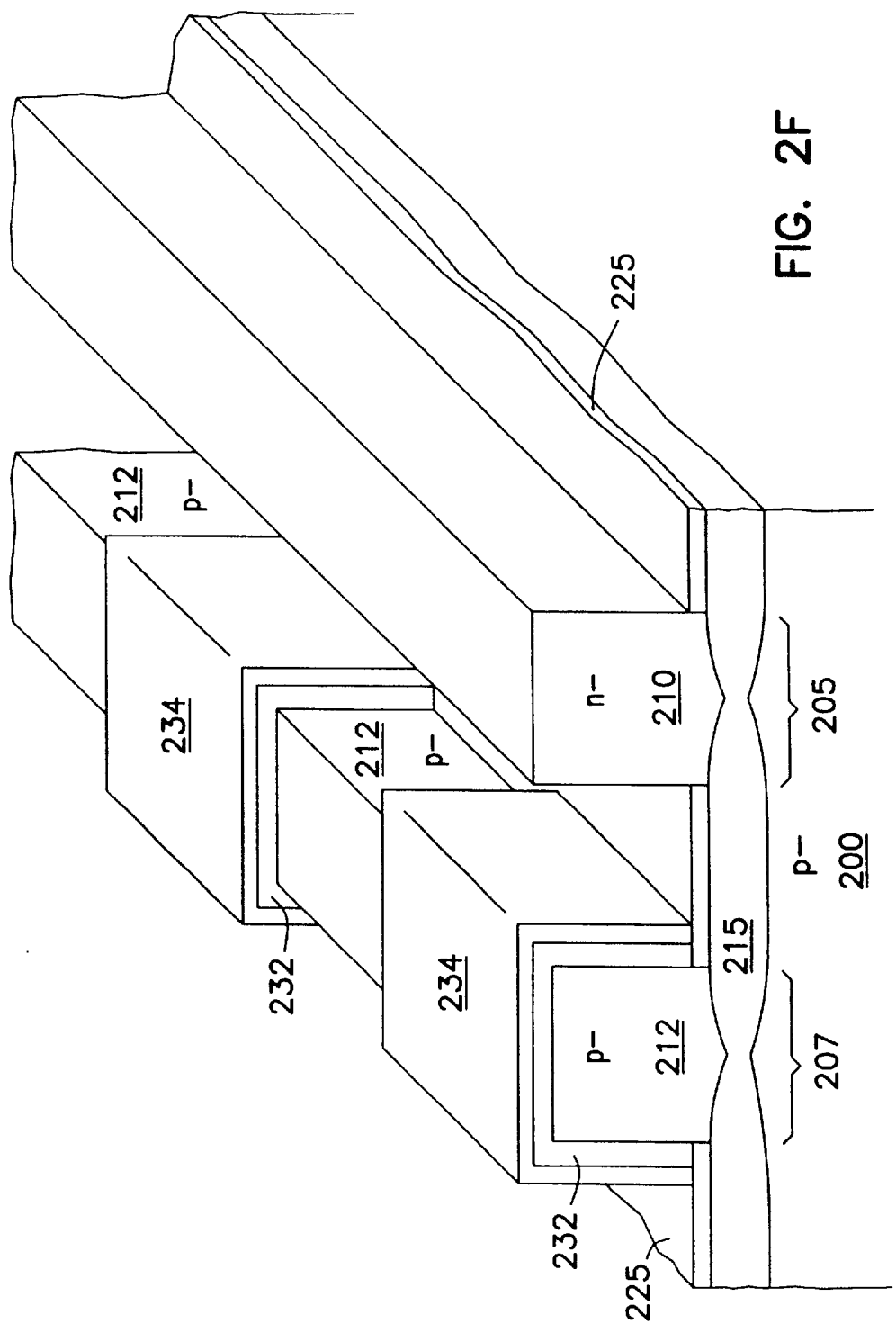

FIG. 2F illustrates the structure following the next series of process steps. The exposed nitride layer 234 and the underlying n-doped glass 232 are removed by any suitable means, such as by RIE. The nitride layer 225 located at the bottom of the trenches 214 serves as an etch stop and protects the underlying insulator layer 215. The photoresist is stripped using conventional stripping techniques. A thin nitride layer 234 remains on the patterned n-doped glass 232 which was shielded by the photoresist. The structure is now as is shown in FIG. 2F.

Figure 2G:
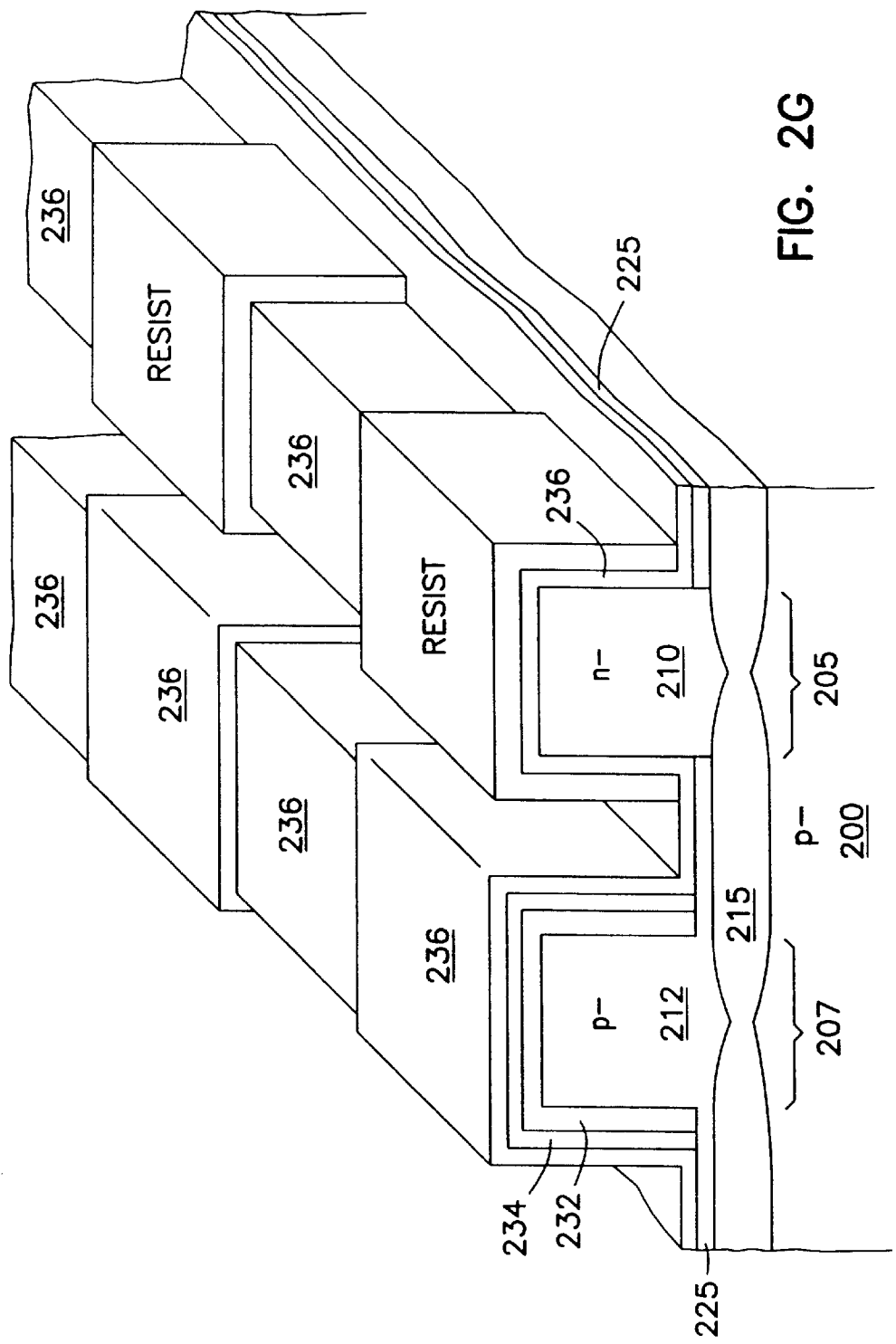

FIG. 2G illustrates the structure following the next sequence of steps. A p-doped glass 236 is deposited by any suitable means such as, for example, CVD. In one embodiment, the p-doped glass 236 is borosilicate glass (BSG). The p-doped glass 236 is deposited to a thickness of approximately 100 nm. Again, a photoresist is applied and exposed, this time to reveal the NMOS device regions 207 and to pattern the p-doped glass 236 in the PMOS device regions 205 in the form of future source/emitter and collector/drain regions. The structure is now as is shown in FIG. 2G.

Figure 2H:
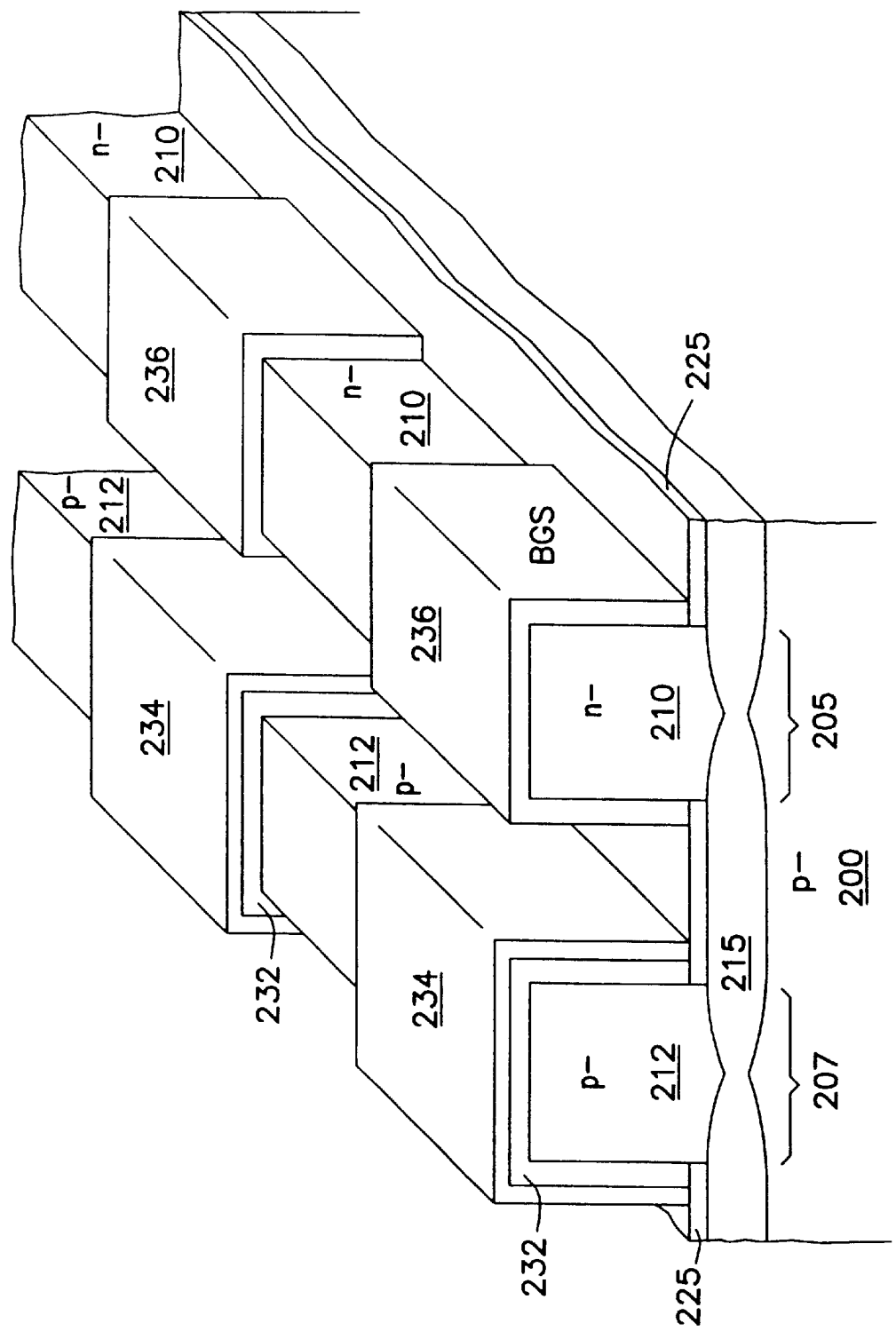
Figure 21:
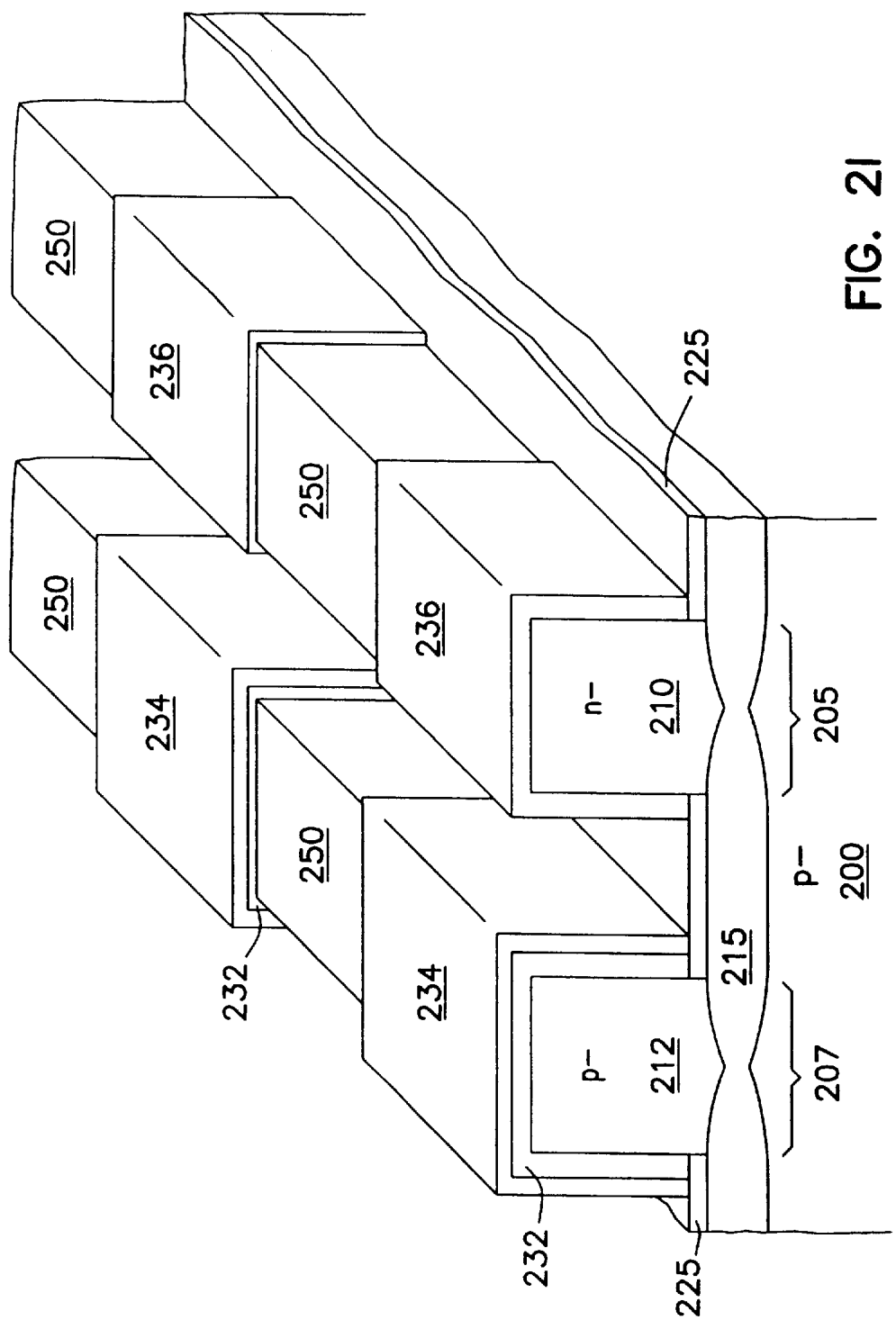

FIG. 2H illustrates the structure following the next series of process steps. The exposed p-doped glass 236 is removed by any suitable means, such as by RIE. The nitride layer 225 located at the bottom of the trenches 214 again serves as an etch stop and protects the underlying insulator layer 215. Also, the thin nitride layer 234 remaining on patterned n-doped glass 232 portions serves as an etch stop and protects the regions of patterned n-doped glass 232. The photoresist is stripped using conventional stripping techniques. The structure is now as shown in FIG. 2H.

FIG. 2I provides a perspective view of the structure after next process step. In this step a gate oxide 250 is thermally grown on the p– single crystalline silicon structure 212 of the NMOS device region 207, and on the n-well single crystalline silicon structure 210 of the PMOS device region 205.

Figure 2J:
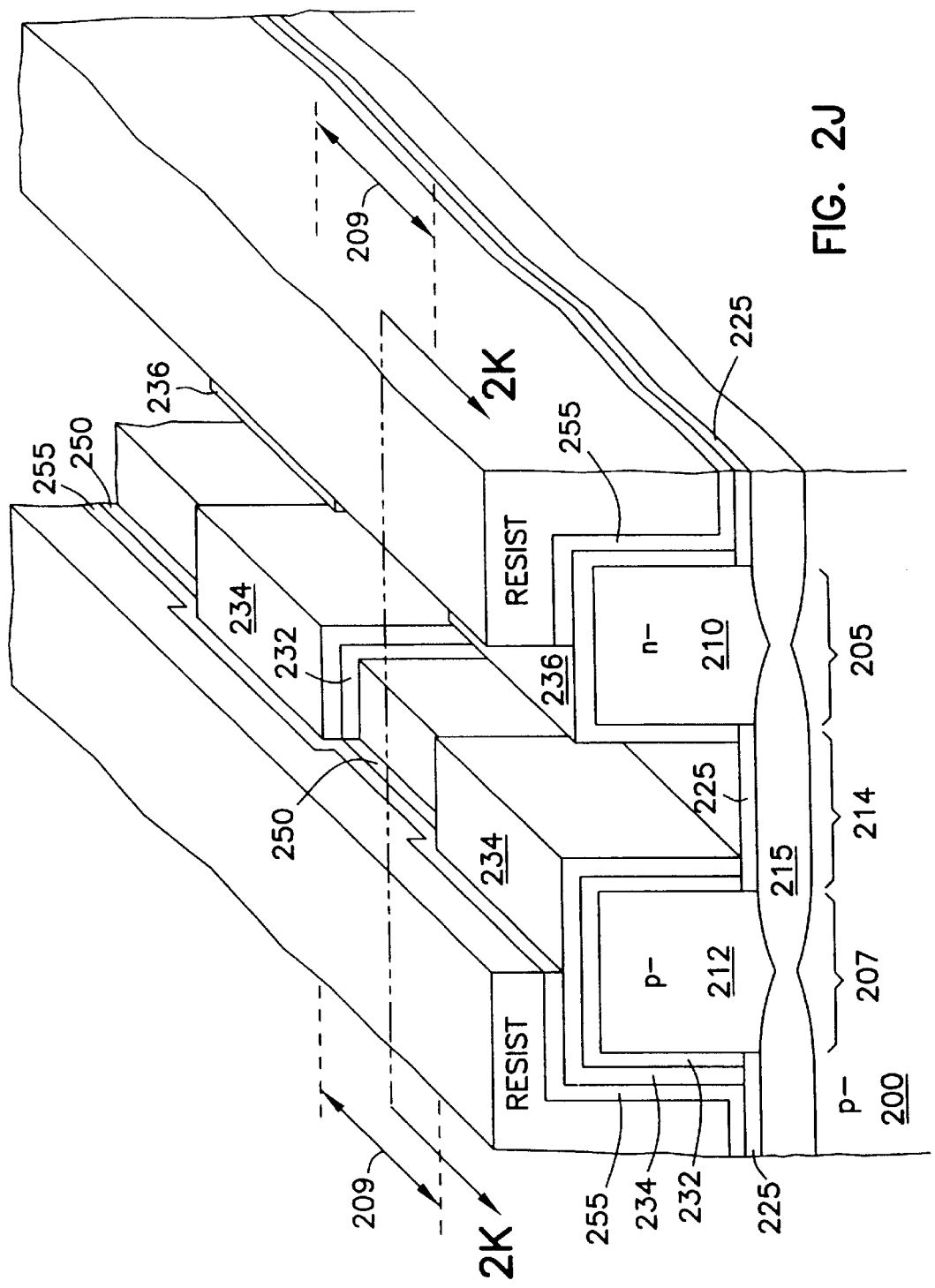

FIG. 2J carries the sequence of process steps further. In FIG. 2J, a thin intrinsic polysilicon layer 255 is deposited, such as by CVD. The intrinsic polysilicon layer 255 is formed to a thickness of approximately 20 nm. A photoresist is applied and exposed to reveal adjacent portions of NMOS and PMOS device regions, 207 and 205 respectively, which share a common trench 214 between the devices. The exposed intrinsic polysilicon layer 255 and the gate oxide 250 are etched back. The etching is performed by any suitable method and can be accomplished using reactive ion etching (RIE). The structure is now as appears in FIG. 2J.

FIG. 2K is a cross-sectional view of the gate region 209 along cut line 2K—2K of FIG. 2J. FIG. 2K illustrates the structure following the next sequence of process steps. The photoresist has been stripped using conventional photoresist stripping techniques. Now, another intrinsic polysilicon layer 260 is deposited across the entire surface. The intrinsic polysilicon layer is deposited by any suitable means, such as by CVD, to a thickness of approximately 100 nm. Next, an n-type dopant is angle implanted, as indicated by arrows 267, to dope the intrinsic polysilicon 260 over the gate oxide 250 in the NMOS device region 207. The implantation is achieved by ion implantation at an angle of approximately 45 degrees. The n-doped intrinsic polysilicon 260 will act as a gate over the gate oxide 250 in the NMOS device region 207. The angled ion implantation simultaneously introduces the n-type dopant, as indicated by arrow 267, into the intrinsic polysilicon 260 on the side of the n-well single crystalline silicon structure 210 opposite the gate oxide 250 side of the PMOS device region 205. The resultant n-doped polysilicon 260 in this location will serve as a body contact to the n-well single crystalline silicon structure 210. In one embodiment, the n-type dopant is Arsenic (As). In another embodiment, the n-type dopant is Phosphorus (P).

In a subsequent process step, but in like fashion to above, a p-type dopant is angle implanted, as indicated by arrows 269, in the opposite direction. The implantation is again achieved by ion implantation at an angle of approximately 45 degrees. This step is performed in order to dope the intrinsic polysilicon 260 over the gate oxide 250 in the PMOS device region 205. The resultant p-doped polysilicon 260 will act as a gate over the gate oxide 250 in the PMOS device region 205. The angled ion implantation simultaneously introduces the p-type dopant, as indicated by arrow 269, into the intrinsic polysilicon 260 on the side of the p– single crystalline silicon structure 212 opposite the gate oxide 250 side of the NMOS device region 207. The p-doped polysilicon 260 in this location will serve as a body contact to the p– single crystalline silicon structure 212. In one embodiment, the p-type dopant is Boron (B). The structure is now as appears in FIG. 2K.

Figure 2L:
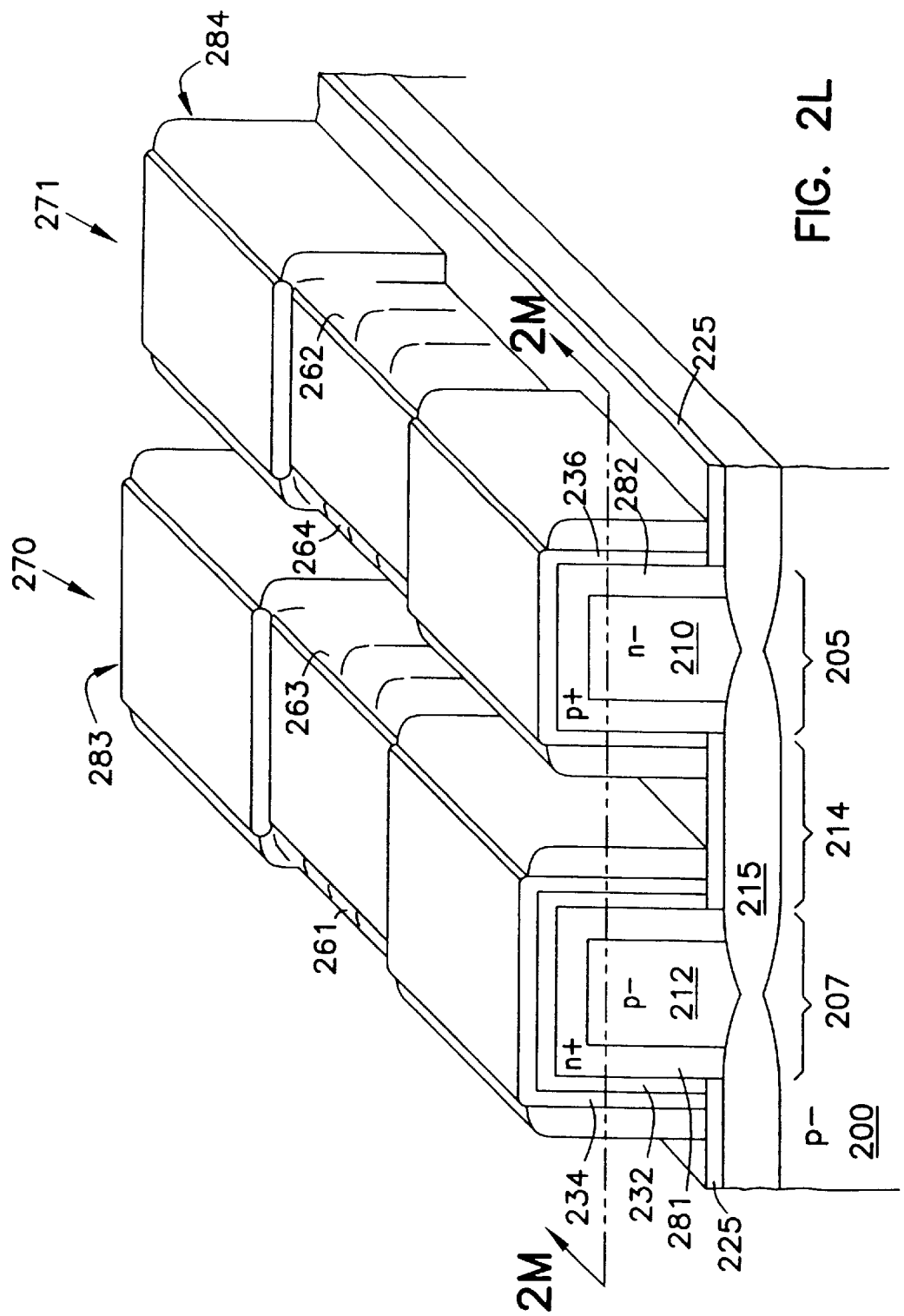

FIG. 2L illustrates the structure, following the next series of process steps. Polysilicon 260 is directionally etched to leave the doped polysilicon only on the vertical side walls of the NMOS and PMOS device regions, 207 and 205 respectively. The structure next undergoes an anneal, such as a rapid thermal anneal (RTA), in order to drive the dopant species from the heavily doped polysilicon 260 into the underlying, undoped polysilicon 255. The anneal also serves to drive the dopant into the n-well single crystalline silicon structure 210 and the p– single crystalline silicon structure 212 from the p-doped glass 236 and the n-doped glass 232 respectively. As one skilled in the art will appreciate, the anneal process also cures out the crystal damage induced by the previous ion implant processes. FIG. 2L illustrates that the anneal step has merged the once separate doped polysilicon layer 260 and undoped polysilicon layer 255. In effect, the anneal step forms a heavily doped n+ gate 261 in the NMOS device region 207, and forms a heavily doped p+ gate 262 in the PMOS device region 205. In the same fashion, the anneal step forms a heavily doped n+ body contact 264 in the PMOS device region 205, and forms a heavily doped p+ body contact 263 in the NMOS device region 207.

Figure 2M:
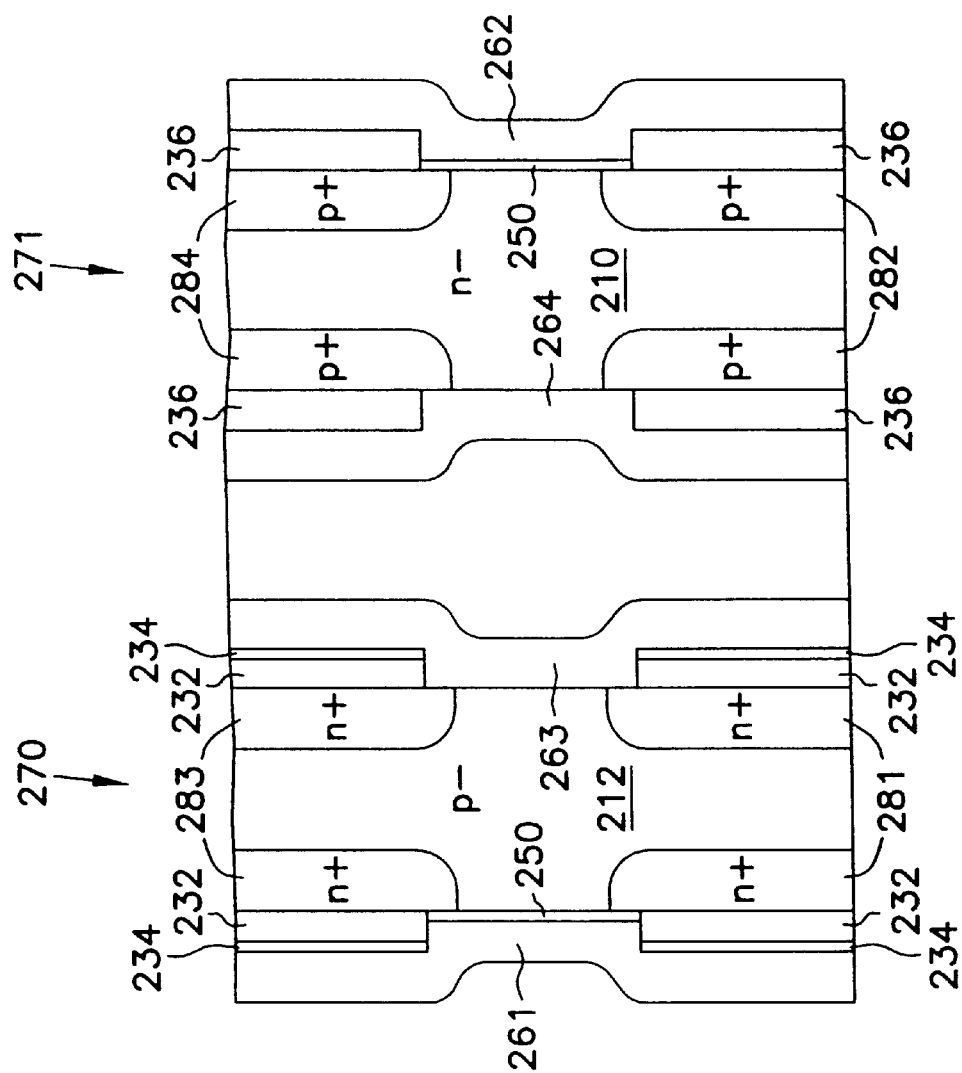

FIG. 2L further provides a broader perspective and illustrates full length NMOS and PMOS devices, 270 and 271 respectively. FIG. 2L illustrates the location of the newly formed source/emitter regions, 281 and 282, and the collector/drain regions, 283 and 284, for the NMOS and PMOS devices, 270 and 271. FIG. 2M is a top view of FIG. 2L taken along cut line 2M—2M Finally, in a final sequence of processing steps, and following conventional method, a photoresist is applied and masked to expose any vertical walls where polysilicon, 261 or 262, is to be removed to terminate gate lines. Such polysilicon, 261 or 262 is then etched back by any suitable method, such as by RIE. The photoresist is stripped using conventional photoresist stripping techniques. An oxide or other insulator is deposited and planarized to fill the trenches 214 between the NMOS and PMOS devices, 270 and 271 respectively. The insulator deposition is performed by any suitable method, such as by CVD. The planarization is also achieved by any suitable technique, such as by CMP.

Contact holes and wiring for both the gate contact and the electrical contact are achieved through conventional processing steps. One skilled in the art will recognize the method to these steps and, hence, they are not disclosed as part of this application.

Conclusion

An improved structure and method for gated lateral bipolar transistors are provided. The present invention conserves die space and achieves enhanced transistor response. The structures offer performance advantages from both metal-oxide semiconductor (MOS) and bipolar junction transistor (BJT) designs. The devices can be used in a variety of applications, digital and analog, wherever a more compact structure with low power consumption and fast response time is needed.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of fabricating a gated lateral bipolar transistor, the method comprising:
    forming a single crystalline semiconductor structure on a substrate, wherein the structure includes a body/base region, an upper surface, and opposing sidewall surfaces;
    forming an insulator layer between the substrate and the single crystalline semiconductor structure;
    forming a source/emitter region and a collector/drain region on a first one of the opposing sidewall surfaces;
    forming a dielectric layer between the source/emitter region and the collector/drain region on the first one of the opposing sidewall surfaces;
    forming a gate on the dielectric layer on the first one of the opposing sidewall surfaces; and
    forming a body contact coupled to the body/base region on a second one of the opposing sidewall surfaces, such that the transistor exhibits both bipolar junction transistors (BJT) and metal-oxide semiconductor (MOS) action.

2. The method of fabricating a gated lateral bipolar transistor of claim 1, wherein forming the body contact comprises forming the body contact of a more highly doped silicon material than that of the body/base region.

3. The method of fabricating a gated lateral bipolar transistor of claim 1, wherein forming the gate and forming the body contact further comprises coupling the gate to the body contact.

4. The method of fabricating a gated lateral bipolar transistor of claim 1, wherein forming the body contact comprises forming the body contact of p+ silicon material, and forming the body/base region includes forming the body/base region of p silicon material.

5. The method of fabricating a gated lateral bipolar transistor of claim 1, wherein forming the body contact comprises forming the body contact of n+ silicon material, and forming the body/base region includes forming the body/base region of n_ silicon material.

6. The method of fabricating a gated lateral bipolar transistor of claim 1, wherein forming the gate and the body contact comprises forming the gate of a first conductivity type material and forming the body contact of a second conductivity type material.

7. The method of fabricating a gated lateral bipolar transistor of claim 1, wherein forming the source/emitter region and a collector/drain region further includes forming a source/emitter region and a collector/drain region on the upper surface and on a second one of the opposing sidewall surfaces.

8. A method of fabricating a gated lateral bipolar transistor, the method comprising:
    forming a single crystalline semiconductor structure, wherein the structure includes a body/base region, an upper surface and opposing sidewall surfaces;
    forming a source/emitter region and a collector/drain region on a first one of the opposing sidewall surfaces;
    forming a pair of conductive sidewall members disposed adjacent to the opposing sidewall members, wherein forming the pair includes forming a gate oxide located between a first one of the pair of conductive sidewall members and the first one of the opposing sidewall surfaces.

9. The method of fabricating a gated lateral bipolar transistor of claim 8, wherein forming the pair of conductive sidewall members further comprises forming a second one of the pair to couple directly to a second one of the opposing sidewall surfaces.

10. The method of fabricating a gated lateral bipolar transistor of claim 8, wherein forming the single crystalline semiconductor structure further includes forming the structure on an insulator layer formed on a p-substrate.

11. The method of fabricating a gated lateral bipolar transistor of claim 8, wherein forming the pair of conductive sidewall members comprises forming a pair of polysilicon.

12. The method of fabricating a gated lateral bipolar transistor of claim 8, wherein forming the pair of conductive sidewall members comprises forming a first one of the pair of a first conductivity type and forming a second one of the pair of a second conductivity type.

13. The method of fabricating a gated lateral bipolar transistor of claim 12, wherein forming the second one of the pair comprises forming the second one to be more highly doped than the body/base region of the single crystalline semiconductor structure.

14. The method of fabricating a gated lateral bipolar transistor of claim 8, wherein forming the pair of conductive sidewall members comprises coupling the pair together.

15. The method of fabricating a gated lateral bipolar transistor of claim 8, wherein forming the pair of conductive sidewall members comprises forming the pair to be independently electrically biased.

16. The method of fabricating a gated lateral bipolar transistor of claim 8, wherein forming the first one of the pair of conductive sidewall members and forming the body/base region comprises forming the first one of the pair from n+ silicon material and the forming the body/base region from p-silicon material.

17. The method of fabricating a gated lateral bipolar transistor of claim 8, wherein forming the first one of the pair of conductive sidewall members and forming the body/base region comprises forming the first one of the pair from p+ silicon material and the forming the body/base region from n-silicon material.

18. A method of fabricating a gated lateral bipolar transistor, the method comprising:
    forming a single crystalline semiconductor structure on a substrate with an insulating layer in between;
    forming a source/emitter region and a collector/drain region separated by a dielectric layer on a first one of first and second opposing sidewall surfaces of the semiconductor structure;
    forming a gate on the dielectric layer; and
    forming a body contact coupled a body/base region on the second opposing sidewall surface so that the transistor exhibits both bipolar junction transistors (BJT) and metal-oxide semiconductor (MOS) action.

19. The method of claim 18, wherein forming the source/emitter region and the collector/drain region includes depositing and patterning n-doped or p-doped glass.

20. The method of claim 18, wherein forming the gate includes performing an angled implantation of dopants into a layer of intrinsic polysilicon overlying the dielectric layer.

21. The method of claim 20, wherein the single crystal semiconductor structure is n-type and the ion implantation introduces n-type dopants into the intrinsic polysilicon layer.

22. The method of claim 20, wherein the single crystal semiconductor structure is p-type and the ion implantation introduces p-type dopants into the intrinsic polysilicon layer.

23. The method of claim 20, wherein the doped intrinsic polysilicon layer is directionally etched to leave a portion of the doped intrinsic polysilicon layer covering the first sidewall surface and the second sidewall surface.

24. The method of claim 23, further including annealing the doped intrinsic polysilicon layer to drive dopants from the doped intrinsic silicon layer into an undoped polysilicon layer underlying the doped polysilicon layer so as to effectively merge the doped and undoped polysilicon layers.

25. The method of claim 24, wherein the dopants are p-type and the annealing forms a heavily doped p-type gate.

26. The method of claim 24, wherein the dopants are n-type and the annealing forms a heavily doped n-type gate.

27. The method of claim 24, wherein the annealing results the body contact comprising a single-layer of doped polysilicon.

28. A method of forming a complementary pair of gated lateral bipolar transistors, comprising:
    selectively etching a substrate to form adjacent p-type and n-type crystalline semiconductor device regions;
    insulating the device regions from the substrate by an insulator layer; forming n+ type source/emitter regions and n+ type collector/drain regions on first and second sidewalls of the n-type device region, spaced apart by a first dielectric layer;
    forming p+ type source/emitter regions and p+ type collector/drain regions on first and second sidewalls of the p-type device region, spaced apart by a second dielectric layer; forming an n+ doped gate on the n-type device region over the first dielectric and a p+ doped gate on the p+ device region over the second dielectric layer; and p forming first and second body contacts on the respective second sidewalls of the n-type and p-type device regions.

29. The method of claim 28, including selectively depositing and etching a layer of n-doped glass to cover the n+ type source/emitter regions.

30. The method of claim 28, including selectively depositing and etching a layer of p+ doped glass to cover the p+ type source/emitter regions.

31. The method of claim 28, wherein the n+ doped gate and the p+ doped gate are formed by:
    depositing a layer of intrinsic polysilicon atop each of the first and second dielectric layers;
    implanting n-type dopants into a portion of the intrinsic polysilicon layer overlying the first dielectric layer; and
    implanting p-type dopants into a portion of the intrinsic polysilicon layer overlying the second dielectric layer.

32. The method of claim 31, further including:
    selectively etching and annealing the n-type and p-type doped intrinsic polysilicon layers.

33. The method of claim 32, wherein annealing merges the doped intrinsic polysilicon layer with an underlying undoped polysilicon layer.

34. A method of fabricating a gated bipolar transistor, the method comprising:
    forming a source/emitter region and a collector/drain region on a first sidewall surface of a single crystalline semiconductor structure;
    forming a gate oxide on the first sidewall surface between the source/emitter region and the collector/drain region;
    forming a first layer of doped glass atop the source/emitter region and a second layer of doped glass atop the collector/drain region;
    forming a first insulating layer atop the first layer of doped glass, and a second insulating layer atop the second layer of doped glass; and
    forming a doped gate atop the first and second insulating layers and the gate oxide.

35. The method of claim 34, wherein the source/emitter region and collector/drain region are n-type and the doped glass is n-type doped glass.

36. The method of claim 34, wherein the source/emitter region and collector/drain region are p-type and the doped glass is p-type doped glass.

37. The method of claim 34, wherein the first and second insulating layers comprise nitride.

38. The method of claim 34, further including forming a body contact on a second surface of the structure opposite the first surface.

39. A method of fabricating a gated bipolar transistor, comprising:
    forming a single crystalline semiconductor structure on a substrate, the structure having first and second sidewalls;

forming an insulator layer between the structure and the substrate;

forming a first pair of a first source/emitter region and a first collector/drain region on the first sidewall and a second pair of a second source/emitter and a second collector/drain region on the second sidewall;

forming a dielectric layer on the first sidewall between the first pair;

forming a gate on the dielectric layer; and forming a body contact on the second sidewall covering the second pair.

40. The method of claim 39, further including coupling the gate to the body contact.

41. The method of claim 39, further including forming a first doped glass layer atop the first pair and a second doped glass layer atop the second pair.

42. A method of fabricating a gate bipolar transistor, comprising:

forming a single crystalline semiconductor structure having first and second sides and insulated from a substrate by an insulating layer;

forming a source/emitter region and a collector/drain region on the first side;

forming a dielectric layer between the source/emitter region and the collector/drain region;

forming an undoped polysilicon layer over the first and second sides, and a doped polysilicon layer over the undoped polysilicon layer;

selectively etching the doped and undoped polysilicon layers to form a gate region on the first side and a body contact region on the second side; and annealing the gate and the body contact regions so that the doped and undoped polysilicon layers merge on the first side to form the doped gate and merge on the second side to form the doped body contact region.

43. The method of claim 42, wherein the doped polysilicon layer comprises first dopants of a first type on the first side and second dopants of a second type on the second side.

44. The method of claim 43, wherein the first dopants are n-type and the second dopants are p-type.

* * * * *

UNITED STATES PATENT AND TRADEMARK OFFICE
CERTIFICATE OF CORRECTION

PATENT NO.    : 6,638,807 B2
DATED         : October 28, 2003
INVENTOR(S)   : Leonard Forbes and Wendell P. Noble Jr.

It is certified that error appears in the above-identified patent and that said Letters Patent is hereby corrected as shown below:

Column 11,
Line 54, delete "silicon" and insert -- polysilicon -- therefor.
Line 55, delete "intrinsic" after "doped".

Column 12,
Line 12, delete "p" before "forming".

Column 13,
Line 8, delete "pair" and insert -- source/emitter region and the first collector/drain region -- therefor.

Signed and Sealed this

Fourth Day of May, 2004

JON W. DUDAS
*Acting Director of the United States Patent and Trademark Office*